(12) United States Patent
Kimura

(10) Patent No.: US 7,615,921 B2
(45) Date of Patent: Nov. 10, 2009

(54) ORGANIC EL DEVICE AND ORGANIC EL PANEL

(75) Inventor: Hiroshi Kimura, Nagano (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 413 days.

(21) Appl. No.: 10/520,005

(22) PCT Filed: Jun. 13, 2003

(86) PCT No.: PCT/JP03/07565

§ 371 (c)(1),
(2), (4) Date: Dec. 14, 2005

(87) PCT Pub. No.: WO2004/112441

PCT Pub. Date: Dec. 23, 2004

(65) Prior Publication Data

US 2006/0124920 A1   Jun. 15, 2006

(51) Int. Cl.
*H05B 33/28* (2006.01)
(52) U.S. Cl. .................. 313/506; 313/503; 313/509
(58) Field of Classification Search .............. 313/503, 313/506, 509
See application file for complete search history.

(56) References Cited

U.S. PATENT DOCUMENTS

| 5,891,554 A * | 4/1999 | Hosokawa et al. .......... 428/212 |
| 5,952,779 A | 9/1999 | Arai et al. |
| 6,501,217 B2 * | 12/2002 | Beierlein et al. ............ 313/504 |

FOREIGN PATENT DOCUMENTS

| JP | 61-220293 | 9/1986 |
| JP | 07-240277 | 9/1995 |
| JP | 2002-243573 | 9/2000 |
| JP | 2001-52874 | 2/2001 |
| JP | 2001052874 | 2/2001 |
| JP | 2001-507167 | 5/2001 |
| JP | 2002-289358 | 4/2002 |
| JP | 2002-289358 | 10/2002 |
| WO | WO-99/39393 A1 | 8/1999 |
| WO | WO 01/39544 | 5/2001 |

* cited by examiner

*Primary Examiner*—Nimeshkumar D. Patel
*Assistant Examiner*—Anthony T Perry
(74) *Attorney, Agent, or Firm*—Rabin & Berdo, P.C.

(57) ABSTRACT

A transparent electrically conductive film comprising one of $In_2O_3$—ZnO, $In_2O_3$—$SnO_2$, ZnO, and $SnO_2$ is provided on a surface of a metal electrode of an organic EL (electroluminescent) device on the light-emitting layer side, and the thickness of this transparent electrically conductive film is set such as to satisfy the following equation, where L is the optical distance from the organic light-emitting layer to the metal electrode, and λ is the emission wavelength, whereby light reflected by the metal electrode is made to undergo interference and thus strengthen itself in the device; as a result, there are provided an organic EL device and an organic EL panel using the same, according to which the external quantum efficiency can be improved with no accompanying deterioration in the brightness, and moreover the contrast can be improved:

$$L=(2n+1)\lambda/4 \; (n=0,1,2,\ldots).$$

19 Claims, 3 Drawing Sheets

ORGANIC EL DEVICE AND ORGANIC EL PANEL

CROSS-REFERENCE TO RELATED APPLICATION

The present application incorporates herein by reference the entire contents and disclosure of the corresponding PCT application PCT/JP2003/007565. Also incorporated herein by reference are the contents and disclosure of the corresponding earlier Japanese application JP PA 2002-074993.

TECHNICAL FIELD

The invention relates to an organic EL (electroluminescent) device and an organic EL panel, and more specifically relates to an organic EL device and an organic EL panel using the same, according to which the external quantum efficiency can be improved with no accompanying deterioration in the brightness, and moreover the contrast can be improved.

REVIEW OF RELATED TECHNOLOGY

Ever since the announcement by Tang in 1987 of a high-efficiency organic EL device having a two-layer laminated structure (C. W. Tang et al., Appl. Phys. Lett., 51, 913 (1987)), various organic EL devices have been developed, and some of these have already been put into practical use.

FIG. 4 is a drawing for explaining the structure of a conventional organic EL device; the device has a constitution in which a hole transport layer 42, a hole injection layer 43, a light-emitting layer 44, an electron transport layer 45, and an electron injection layer 46 are formed in this order on a transparent electrode 41, which is an anode, and a metal electrode 47, which is a cathode, is provided on the electron injection layer 46.

In FIG. 4, the hollow arrow indicates light direction.

The quantum efficiency of an organic EL device having a structure as shown in FIG. 4 is thought of as follows. First, holes and electrons arriving from the anode and the cathode form electron-hole pairs in the light-emitting layer, thus becoming excitons having light-emitting ability; the probability of production of such a light-emitting exciton is approximately 25%. The efficiency $\chi$ of extracting light produced in the light-emitting layer out to the outside of the device, on the other hand, is given by the following equation, where n is the refractive index of the light-emitting layer:

$$\chi = 1/(2n_2) \tag{1}$$

Generally, the refractive index of the light-emitting layer is 1.6, and hence the efficiency $\chi$ of extracting out light is approximately 20%. The theoretical external quantum efficiency limit is thus given by the product of the probability of production of a light-emitting exciton (approximately 25%) and the efficiency of extracting out light (approximately 20%), which is approximately 5%.

However, the external quantum efficiency of an actual organic EL device is low, at approximately 3%, which is about 60% of the theoretical value, and hence a problem arises in that if the current passed through the device is increased to extract light of a fixed brightness to the outside, then deterioration of the brightness will progress, and in addition the energy consumption will be increased.

Moreover, with actual panels, a problem of contrast in which the display becomes hard to see due to external light is a problem. One cause of such a drop in the contrast is said to be the metal electrode reflecting external light.

In view of such problems, it is an object of the invention to provide an organic EL device and an organic EL panel using the same, according to which the external quantum efficiency can be improved with no accompanying deterioration in the brightness, and moreover the contrast can be improved.

SUMMARY OF THE INVENTION

The invention has been accomplished to solve the above problems. The invention can include an organic EL (electroluminescent) device comprising an organic EL light-emitting part including an organic light-emitting layer, between a metal electrode and a transparent electrode, characterized in that a transparent electrically conductive film is provided on a surface of the metal electrode on the organic EL light-emitting part side, and the thickness of the transparent electrically conductive film is set such as to satisfy the following equation, where L is the optical distance from the organic light-emitting layer to the metal electrode, and $\lambda$ is the wavelength of light emitted by the organic light-emitting layer:

$$L = (2n+1)\lambda/4 \; (n=0, 1, 2, \ldots) \tag{2}$$

Moreover, the invention can include the organic EL devices described above, characterized in that a material of the transparent electrically conductive film is one of $In_2O_3$—ZnO, $In_2O_3$—$SnO_2$, ZnO, and $SnO_2$.

Moreover, the invention can be characterized in that the transparent electrically conductive film has an impurity added thereto so as to be colored to a color the same as the color of the light emitted by the organic EL light-emitting layer. Such an organic EL device can be further characterized in that the organic EL light-emitting layer emits blue light, the transparent electrically conductive film is constituted from a material of one of $In_2O_3$—ZnO, $In_2O_3$—$SnO_2$, ZnO and $SnO_2$, containing an impurity of one of CuO, Co and Ti at a concentration of not more than 1%, and the transparent electrically conductive film absorbs light other than blue light.

Moreover, the invention includes a monochrome panel or area color panel, characterized by comprising the organic EL device as set out above.

Moreover, can include a color conversion type color panel, characterized by comprising the organic EL device as set out above, a blue monochrome backlight, and color-converting filters, wherein light other than blue light is absorbed by the transparent electrically conductive film of the organic EL device, and only blue monochrome light from the backlight is reflected by the metal electrode.

The invention as described above can be characterized in that the organic EL light-emitting layer emits blue light, the metal electrode comprises Zn, Mo or Cr, or an alloy thereof, and the metal electrode absorbs light other than blue light. Moreover, such can include is a color conversion type color panel, characterized by comprising the organic EL device as described above, a blue monochrome backlight, and color-converting filters, wherein light other than blue light is absorbed by the metal electrode, and only blue monochrome light from the backlight is reflected by the metal electrode.

BRIEF DESCRIPTION OF THE DRAWING FIGURES

Figure 4:
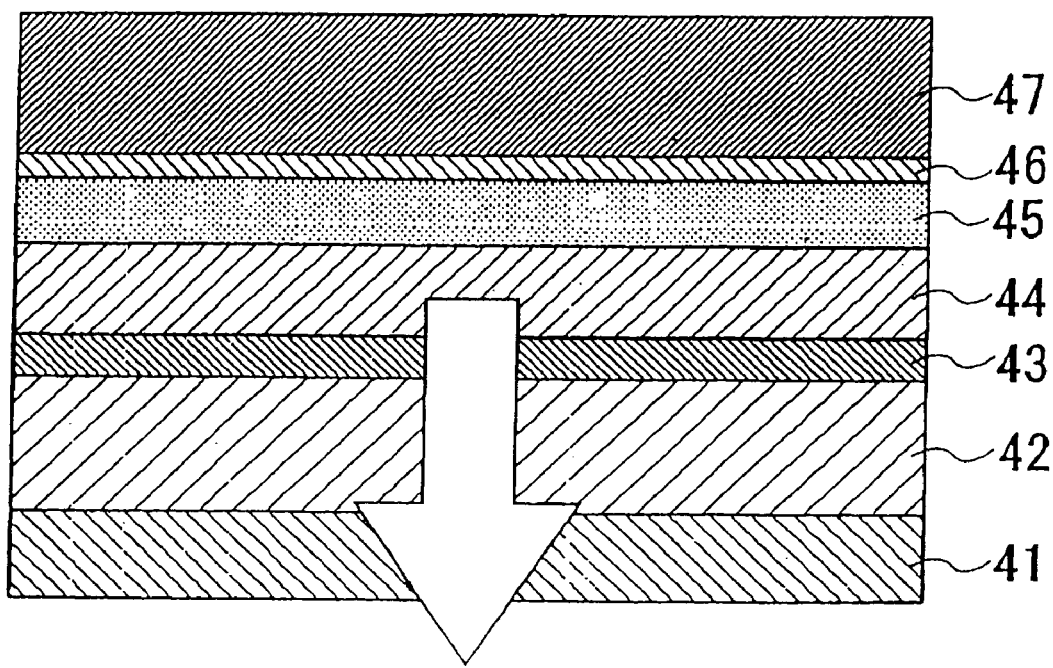

FIG. 4, labeled "prior art," is a cross-sectional view illustrating the structure of a conventional organic EL device.

DETAILED DECRIPTION OF THE PREFERRED EMBODIMENTS

The following is a description of embodiments of the invention with reference to the drawings.

Figure 1:
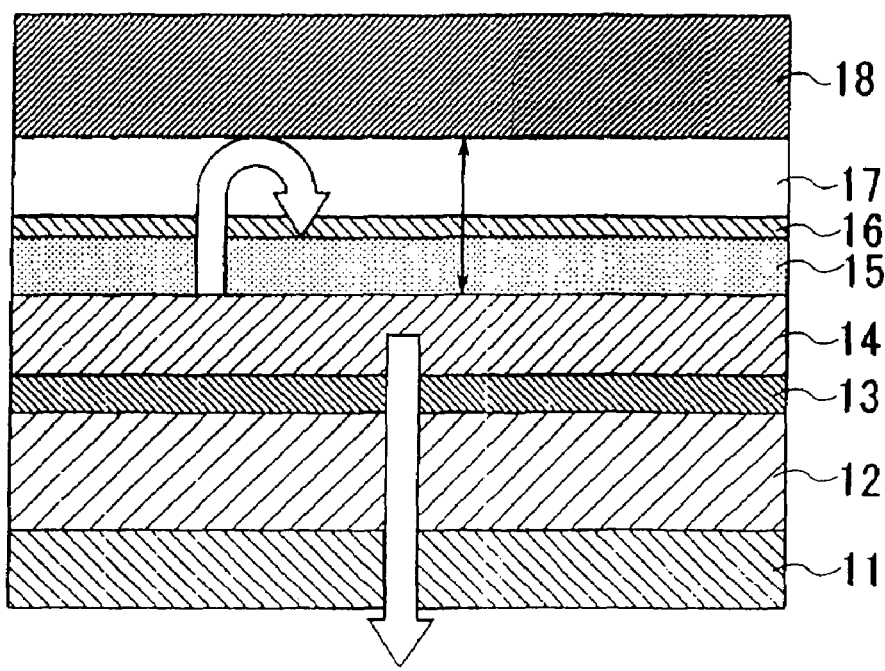
FIG. 1 is a cross-sectional view for explaining an example of the constitution of an organic EL device of the invention.

FIG. 1 is a drawing for explaining an example of the constitution of an organic EL (electroluminescent) device of the invention formed on a substrate; this organic EL device includes an organic EL light-emitting part constituted from a plurality of organic layers including an organic light-emitting layer, and specifically has a constitution in which a hole injection layer 12, a hole transport layer 13, a light-emitting layer 14, an electron transport layer 15, and an electron injection layer 16 are formed in this order on a transparent electrode 11, which is an anode. A transparent electrically conductive film 17 is provided on the electron injection layer 16, and a metal electrode 18, which is a cathode metal layer, is provided on the transparent electrically conductive film 17. Note that when constituting the organic EL device of the invention, a glass substrate may be provided on either the transparent electrode 11 (the anode), or the metal electrode 18 (the cathode metal layer).

Of the light emitted from the light-emitting layer 14, the light emitted toward the hole transport layer 13 side passes through the hole transport layer 13 and the hole injection layer 12 and is extracted to the outside through the transparent electrode 11; this light is indicated by the straight, hollow, downward-pointing arrow in FIG. 1. The light emitted to the electron transport layer 15 side passes through the electron transport layer 15, the electron injection layer 16 and the transparent electrically conductive film 17, and is reflected by the metal electrode 18 and thus returns into the device; this light is indicated by the reverse-curving or J-shaped hollow arrow in FIG. 1. Consequently, if this reflected light can be extracted to the outside without being weakened in the device, then the external quantum efficiency can be improved.

That is, taking the thicknesses and refractive indices of the electron transport layer 15, the electron injection layer 16 and the transparent electrically conductive film 17 in the device to be $d_i$ (i=1, 2, 3) and $n_i$ (i=1, 2, 3) respectively, the optical distance L from the light-emitting layer 14 to the metal electrode 18 will be given by the sum of the optical distances for these layers, i.e. by the following equation.

$$L = \Sigma_i n_i d_i \quad (4)$$

An optical distance is shown in FIG. 1 by the vertical, thin-line double-headed arrow.

When light is reflected at the interface between the metal electrode 18 and the transparent electrically conductive film 17, the phase of the light is reversed, and hence taking the wavelength of the light to be $\lambda$, a condition for the light strengthening itself in the device is:

$$L = (2n+1)\lambda/4 \quad (n=0, 1, 2, \ldots) \quad (5)$$

Because the metal electrode 18 is used as the cathode, and the electron transport layer 15, the electron injection layer 16 and the transparent electrically conductive film 17 are interposed between the metal electrode 18 and the light-emitting layer 14, if design is carried out such that the optical distance accounted for by these layers satisfies equation (5), then the external quantum efficiency can be improved.

However, the thickness of the electron injection layer 16 must be made low at approximately 0.5 to 1 nm, and moreover if the thickness of the electron transport layer 15 is made to be high then there will be a problem of deterioration of the brightness of the device becoming marked; consequently, with the organic EL device of the invention, the transparent electrically conductive film 17 is provided between the electron injection layer 16 and the metal electrode 18, and the thickness of the transparent electrically conductive film 17 is set such that the light reflected by the metal electrode 18 satisfies the above interference condition, whereby the light can be extracted to the outside without the strength of the light being weakened in the device, and hence the external quantum efficiency can be improved.

The method of setting the optical distance such that the external quantum efficiency is maximized by adjusting the thickness of the transparent electrically conductive film 17 in this way is not only effective with a monochrome panel or area color panel that is made to emit light using a monochrome backlight, but moreover is particularly effective with a color panel that uses a color conversion method in which light emitted from a monochrome backlight is received by color-converting layers and converted into red, green and blue light.

Moreover, one practical problem of organic EL panels is a drop in contrast due to external light, and it has been ascertained that a cause of this is external light being directly reflected by the metal electrode. According to equation (5), there is limited light of wavelengths strengthened by interference, with only light of specific wavelengths being reflected; the strength of reflection of light of wavelengths not satisfying equation (5) will thus be reduced, and hence it can be seen that the organic EL device of the invention contributes to improving the contrast of an organic EL panel.

To further improve the contrast, it is effective to form the transparent electrically conductive film and the metal layer on top of one another to constitute a reflective layer, and color the transparent electrically conductive film out of this reflective layer to the color of the emitted light, thus producing a structure according to which light of colors other than the color of the emitted light cannot be reflected, or make the material of the metal layer be a material having a property of absorbing light of colors other than the color of the emitted light. One can thus envisage a method in which light of wavelengths not required to be extracted out from the transparent electrode are absorbed by the laminate of the transparent electrically conductive film and the metal layer, or a method in which this light is absorbed by the metal layer material. Note that, in this case, it is preferable to constitute the various layers such that the optical distance for the layers interposed between the metal electrode and the light-emitting layer satisfies equation (5), but there is no limitation to this.

In particular, with a color conversion type color panel, the backlight is blue, and hence it is effective to use a metal having a larger reflection coefficient for blue than for red as the reflective metal; specifically, Zn, Mo or Cr may be used. Moreover, the transparent electrically conductive film can be made blue by, for example, adding CuO, Co or Ti in an amount of not more than 1% to the oxide layer constituting the transparent electrically conductive film.

Figure 2:
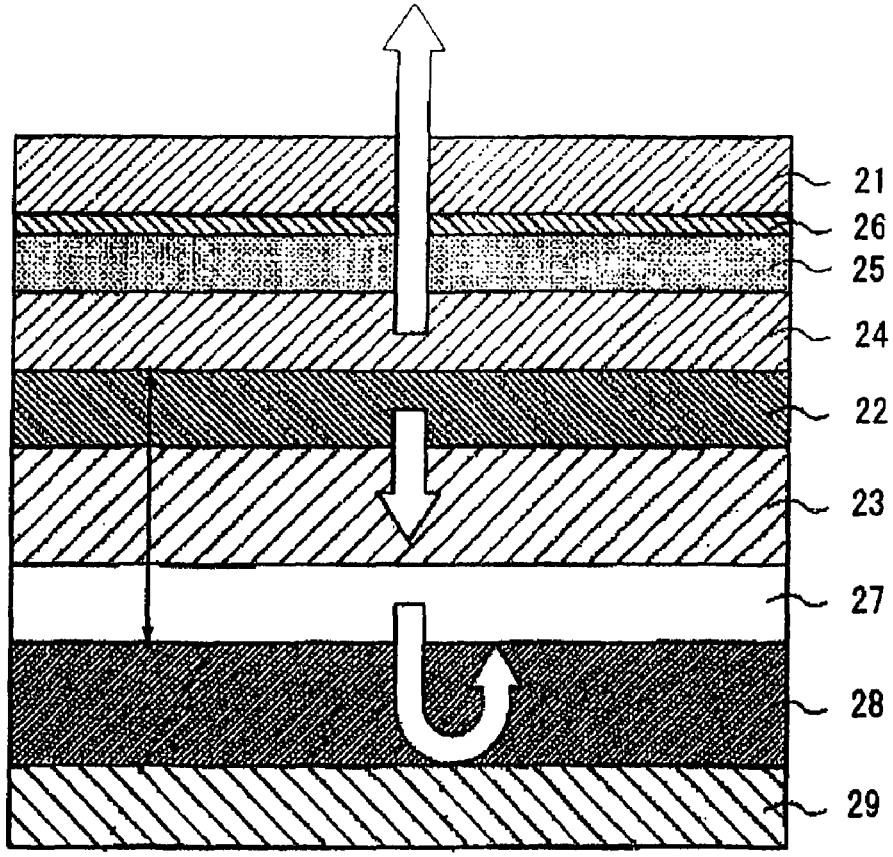
FIG. 2 is a cross-sectional view for explaining a second example of the constitution of an organic EL device of the invention.

In addition to the constitution shown in FIG. 1, an organic EL device of the invention may have the constitution shown in FIG. 2.

FIG. 2 is a drawing for explaining the structure in the case that the lower electrode of the organic EL device is made to be an anode; with this constitution, a metal electrode 28, a transparent electrically conductive film 27, which is an anode, a hole injection layer 23, a hole transport layer 22, a light-emitting layer 24, an electron transport layer 25, an electron injection layer 26, and a transparent electrode 21, which is a cathode, are formed in this order on a substrate 29. Here, regarding the constitution of the part comprising the electron injection layer 26 and the transparent electrode 21 (the cathode), one can envisage a structure in which the electron injection layer 26 is formed from an ultra-thin film of an alkali or alkaline earth metal oxide, fluoride, boride or chloride, an ultra-thin film of a metal such as Al is deposited thereon, and an $In_2O_3$—ZnO oxide layer (IZO) is further provided thereon, or a structure in which a transparent electrode 21 made of a transparent oxide such as IZO is directly deposited on the electron injection layer 26.

In FIG. 2, the hollow arrows indicate light direction and reflection as in claim 1 and the thin, vertical, double-headed arrow indicates an optical distance.

Note that in addition to organic EL devices having the layer structures shown in FIGS. 1 and 2, the invention can also be applied to organic EL devices having all other organic EL device constitutions proposed hitherto, for example a constitution in which a hole transport layer is not provided.

EXAMPLE 1

Figure 3:
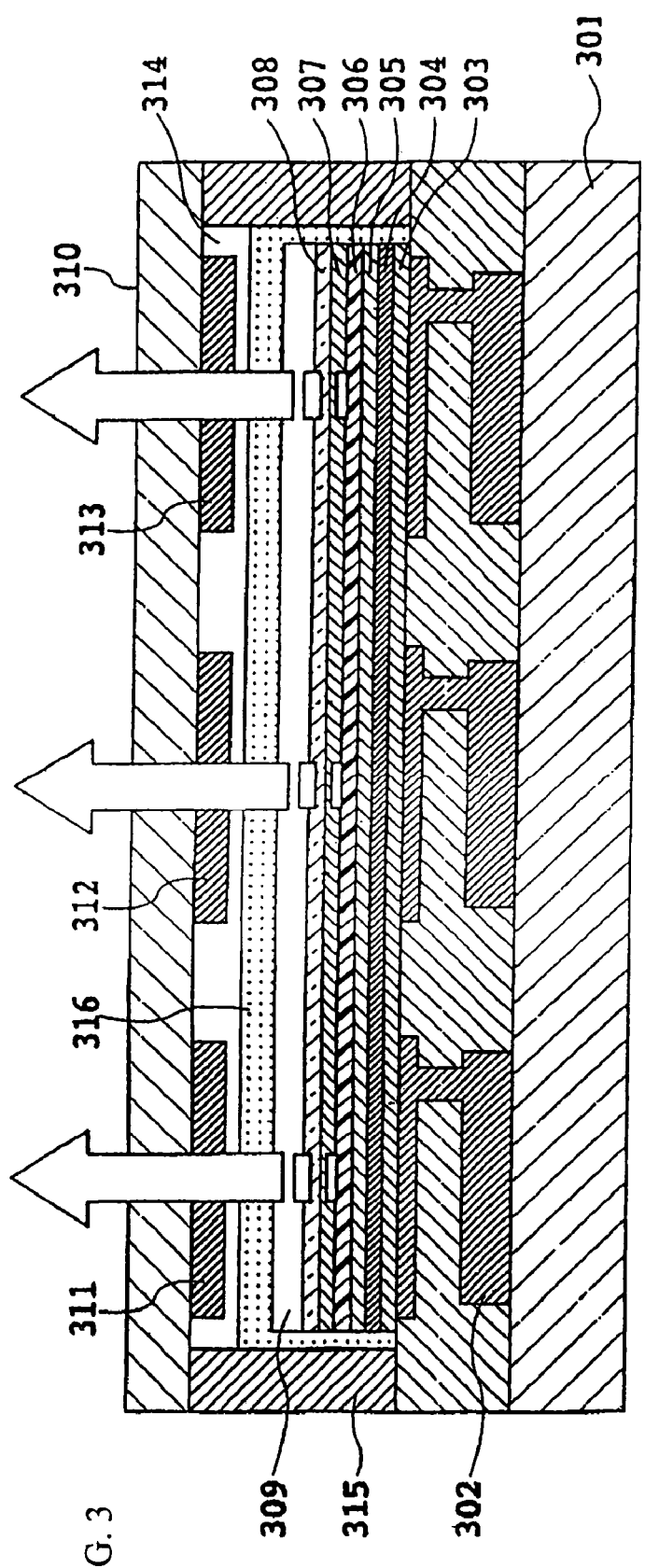
FIG. 3 is a cross-sectional view of a color conversion type color panel constituted using an organic EL device of the invention.

FIG. 3 is a sectional view of a color conversion type color panel constituted using an organic EL device of the invention. Cr (5 nm) and Pt (100 nm) were deposited as a metal electrode 303 as reflective metal on a substrate 301 having TFTs 302 thereon, and then an $In_2O_3$—ZnO oxide layer (IZO: refractive index 2.2) was further deposited as a transparent electrically conductive film 304 acting as an anode on the metal electrode 303. The metal electrode 303 used here as the reflective metal is not limited to being a laminate of Cr and Pt so long as it is an electrically conductive metal or alloy having unevenness of not more than 4 nm. Moreover, the formation of the IZO film was carried out by sputtering, but may instead be carried out using another film formation method such as electron beam vapor deposition or resistive heating vapor deposition.

A hole injection layer 305, a hole transport layer 306, and a light-emitting layer 307 were deposited in this order on the transparent electrically conductive film 304 by resistive heating vapor deposition, and then an 8-hydroxyquinoline Al complex ($Alq_3$) was further formed thereon to a thickness of 20 nm as an electron transport layer 308.

A laminate 309 of an electron injection layer and an upper transparent electrode was constituted by depositing LiF to a thickness of 0.5 nm as the electron injection layer, then depositing 1 nm of Al and 220 nm of IZO as the upper transparent electrode, and then finally depositing 300 nm of SiON as a protective layer.

The optical distance for the organic EL device having this constitution was adjusted between the IZO transparent electrically conductive film 304 that was the lower electrode (the anode), the hole injection layer 305, the hole transport layer 306, and the Pt film in the metal electrode 303. The wavelength of the light from the color conversion type backlight was 470 nm, and the hole injection layer 305 was deposited to a thickness of 80 nm and the hole transport layer 306 to a thickness of 20 nm; consequently, taking the refractive index of the organic material to be 1.85, from the interference condition of equation (5) the IZO film thickness was made to be 183 nm. Furthermore, the IZO film that was the transparent electrically conductive film 304 constituting the lower electrode was colored blue by adding 0.6% of CuO thereto.

A protective layer 316 was provided on the substrate 301 on which the device had been formed as described above, and this substrate and a substrate 310 on which red, green and blue color-converting filters 311, 312 and 313 had been formed in advance were put face to face, and then with a gap therebetween filled with a gel body 314, an outer peripheral portion of the device was sealed with an outer periphery sealant 315, thus completing the panel. Here, 'color-converting filters' are filters provided with fluorescent filters and/or color filters.

As a result of comparing the properties of the panel having the constitution described in the present example with the properties of a panel having a conventional constitution, it was found that the efficiency of extracting out light could be improved from 2.0% to 3.0%, and hence the current passed at the same brightness could be reduced to $\frac{2}{3}$. Furthermore, a contrast ratio of 200:1 at 100 $cd/m^2$ under 1000 Lx was obtained.

Moreover, upon carrying out similar comparative experiments with monochrome and area color panels, similar results were obtained.

In FIG. 3, the hollow arrows indicate light direction.

EXAMPLE 2

The same comparison as in Example 1 was carried out but using $In_2O_3$—$SnO_2$ (ITO) (refractive index 2.0) of film thickness 201 nm instead of $In_2O_3$—ZnO as the transparent electrically conductive film material; in this case, similar effects to with Example 1 were again obtained. The ITO film can be deposited using a method such as sputtering, vapor deposition or CVD. Moreover, similar results were also obtained in the case of using ZnO or $SnO_2$ as the transparent electrically conductive film material and adjusting the optical distance.

As described above, according to the invention, a transparent electrically conductive film is provided on a surface of a metal electrode of an organic EL device on the light-emitting layer side, and the thickness of this transparent electrically conductive film is adjusted such that light reflected by the metal electrode is made to undergo interference and thus strengthen itself in the device, whereby the external quantum efficiency can be improved with no accompanying deterioration in the brightness; furthermore, light of a specific wavelength is made to be absorbed by the metal electrode and the transparent electrically conductive film, and hence the contrast is improved; as a result, there can be provided an organic EL device and an organic EL panel using the same, according to which the external quantum efficiency can be improved with no accompanying deterioration in the brightness, and moreover the contrast can be improved.

The invention claimed is:

1. An organic electroluminescent devices, comprising:
a metal electrode;
a transparent electrode;
an organic electroluminescent light-emitting layer between the metal electrode and the transparent electrode;
a transparent electrically conductive film on a surface of the metal electrode, on the organic electroluminescent light-emitting layer side thereof,
first means, disposed between the organic electroluminescent light-emitting layer and the transparent electrically conductive film, for injecting first carriers and transporting the first carriers to the organic electroluminescent light-emitting layer, the first means comprising at least one layer of material;
second means, disposed between the organic electroluminescent light-emitting layer and the transparent electrode, for injecting second carriers and transporting the second carriers to the organic electroluminescent light-emitting layer, the first means comprising at least one further layer of material, wherein the first carriers are one of holes and electrons and the second carriers are the other of holes and electrons; and wherein the transparent electrically conductive film has a thickness that is set so as to satisfy the following equation, where L is the optical distance from the organic light-emitting layer to the metal electrode, and $\lambda$ is the wavelength of light emitted by the organic light-emitting layer:

$$L=(2n+1)\lambda/4\ (n=0,1,2,\ldots).$$

2. The organic electroluminescent device according to claim 1, wherein a material of the transparent electrically conductive film is one of $In_2O_3$—ZnO, $In_2O_3$—$SnO_2$, ZnO and $SnO_2$.

3. A monochrome panel or area color panel, including the organic electroluminescent device according to claim 1.

4. The organic electroluminescent device according to claim 1, wherein a material of the transparent electrically conductive film is one of $In_2O_3$—ZnO and $In_2O_3$—$SnO_2$.

5. An organic electroluminescent devices, comprising:
a metal electrode;
a transparent electrode;
an organic electroluminescent light-emitting layer between the metal electrode and the transparent electrode;
a transparent electrically conductive film on a surface of the metal electrode, on the organic electroluminescent light-emitting layer side thereof,
wherein light of wavelengths different than the wavelength of light emitted by the organic light-emitting layer is absorbed by at least one of the metal electrode and the transparent electrically conductive film, and only light of the wavelength emitted by the organic electroluminescent light-emitting layer is discharged from the transparent electrode, and
wherein the organic electroluminescent light-emitting layer emits blue light, the transparent electrically conductive film is constituted from a material of one of $In_2O_3$—ZnO, $In_2O_3$—$SnO_2$, ZnO and $SnO_2$, containing an impurity of one of CuO, Co and Ti at a concentration of not more than 1%, and the transparent electrically conductive film absorbs light other than blue light.

6. The organic electroluminescent device according to claim 5, wherein a material of the transparent electrically conductive film is one of $In_2O_3$—ZnO and $In_2O_3$—$SnO_2$.

7. A monochrome panel or area color panel, including the organic electroluminescent device according to claim 5.

8. The organic electroluminescent device according to claim 5, wherein the organic electroluminescent light-emitting layer emits blue light, the metal electrode comprises Zn, Mo or Cr, or an alloy thereof; and the metal electrode absorbs light other than blue light.

9. The organic electroluminescent device according to claim 5, wherein the transparent electrically conductive film has an impurity added thereto so as to be colored to a color the same as the color of the light emitted by the organic electroluminescent light-emitting layer.

10. A color conversion type color panel, comprising the organic electroluminescent device according to claim 5, a blue monochrome backlight, and color-converting filters, wherein light other than blue light is absorbed by the transparent electrically conductive film of the organic electroluminescent device, and only blue monochrome light from the backlight is reflected by the metal electrode.

11. A color conversion type color panel, comprising:
an organic electroluminescent device comprising
a metal electrode,
a transparent electrode,
an organic electroluminescent light-emitting layer between the metal electrode and the transparent electrode,
a transparent electrically conductive film that is provided on a surface of the metal electrode, on the organic electroluminescent light-emitting layer side thereof,
first means, disposed between the organic electroluminescent light-emitting layer and the transparent electrically conductive film, for injecting first carriers and transporting the first carriers to the organic electroluminescent light-emitting layer, the first means comprising at least one layer of material, and
second means, disposed between the organic electroluminescent light-emitting layer and the transparent electrode, for injecting second carriers and transporting the second carriers to the organic electroluminescent light-emitting layer, the first means comprising at least one further layer of material;
a blue monochrome backlight; and
color-converting filters,
wherein the first carriers are one of holes and electrons and the second carriers are the other of holes and electrons;
wherein light of wavelengths different than the wavelength of light emitted by the organic light-emitting layer is absorbed by at least one of the metal electrode and the transparent electrically conductive film, and only light of the wavelength emitted by the organic electroluminescent light emitting layer is discharged from the transparent electrode; and
wherein light other than blue light is absorbed by the metal electrode, and only blue monochrome light from the backlight is reflected by the metal electrode.

12. An organic electroluminescent devices comprising;
a metal electrode;
a transparent electrode;
an organic electroluminescent light-emitting layer between the metal electrode and the transparent electrode;
a transparent electrically conductive film on a surface of the metal electrode, on the organic electroluminescent light-emitting layer side thereof,
first means, disposed between the organic electroluminescent light-emitting layer and the transparent electrically conductive film, for injecting first carriers and transporting the first carriers to the organic electroluminescent light-emitting layer, the first means comprising at least one layer of material;
second means, disposed between the organic electroluminescent light-emitting layer and the transparent electrode, for injecting second carriers and transporting the second carriers to the organic electroluminescent light-emitting layer, the first means comprising at least one further layer of material,
wherein the first carriers are one of holes and electrons and the second carriers are the other of holes and electrons;
wherein the transparent electrically conductive film has a thickness that is set so as to satisfy the following equation, where L is the optical distance from the organic light-emitting layer to the metal electrode, and λ is the wavelength of light emitted by the organic light-emitting layer:

$$L=(2n+1)\lambda/4\ (n=0,1,2,\ldots);\ \text{and}$$

wherein light of wavelengths different than the wavelength of light emitted by the organic electroluminescent light-emitting layer is absorbed by at least one of the metal electrode and the transparent electrically conductive film, and only light of the wavelength emitted by the organic electroluminescent light-emitting layer is discharged from the transparent electrode.

13. The organic electroluminescent device according to claim 12, wherein a material of the transparent electrically conductive film is one of $In_2O_3$—ZnO, $In_2O_3$—$SnO_2$, ZnO and $SnO_2$.

14. A monochrome panel or area color panel, including the organic electroluminescent device according to claim 12.

15. The organic electroluminescent device according to claim 12, wherein the organic electroluminescent light-emitting layer emits blue light, the metal electrode comprises Zn, Mo or Cr, or an alloy thereof, and the metal electrode absorbs light other than blue light.

16. A color conversion type color panel, comprising the organic electroluminescent device according to claim 15, a blue monochrome backlight, and color-converting filters, wherein light other than blue light is absorbed by the metal electrode, and only blue monochrome light from the backlight is reflected by the metal electrode.

17. The organic electroluminescent device according to claim 12, wherein the transparent electrically conductive film has an impurity added thereto so as to be colored to a color the same as the color of the light emitted by the organic electroluminescent light-emitting layer.

18. An organic electroluminescent device, comprising
a metal electrode;
a transparent electrode;
an organic electroluminescent light-emitting layer between the metal electrode and the transparent electrode; and
a transparent electrically conductive film on a surface of the metal electrode, on the organic electroluminescent light-emitting layer side;

wherein the transparent electrically conductive film has a thickness that is set so as to satisfy the following equation, where L is the optical distance from the organic light-emitting layer to the metal electrode, and λ is the wavelength of light emitted by the organic light-emitting layer:

$$L=(2n+1)\lambda/4\ (n=0,1,2,\ldots);$$

wherein light of wavelengths different than the wavelength of light emitted by the organic electroluminescent light-emitting layer is absorbed by at least one of the metal electrode and the transparent electrically conductive film, and only light of the wavelength emitted by the organic electroluminescent light-emitting layer is discharged from the transparent electrode;

wherein the transparent electrically conductive film has an impurity added thereto so as to be colored to a color the same as the color of the light emitted by the organic electroluminescent light-emitting layer; and wherein the organic electroluminescent light-emitting layer emits blue light, the transparent electrically conductive film is constituted from a material of one of $In_2O_3$—ZnO, $In_2O_3$—$SnO_2$, ZnO and $SnO_2$, containing an impurity of one of CuO, Co and Ti at a concentration of not more than 1%, and the transparent electrically conductive film absorbs light other than blue light.

19. A color conversion type color panel, comprising the organic electroluminescent device according to claim 18, a blue monochrome backlight, and color-converting filters, wherein light other than blue light is absorbed by the transparent electrically conductive film of the organic electroluminescent device, and only blue monochrome light from the backlight is reflected by the metal electrode.

* * * * *

UNITED STATES PATENT AND TRADEMARK OFFICE
CERTIFICATE OF CORRECTION

PATENT NO.       : 7,615,921 B2
APPLICATION NO.  : 10/520005
DATED            : November 10, 2009
INVENTOR(S)      : Hiroshi Kimura It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 745 days.

Signed and Sealed this

Nineteenth Day of October, 2010

David J. Kappos
*Director of the United States Patent and Trademark Office*